United States Patent
Dreville

(10) Patent No.: US 7,219,297 B2
(45) Date of Patent: May 15, 2007

(54) METHOD AND DEVICE FOR GENERATING A SYNCHRONIZATION VARIABLE AND THE CORRESPONDING INTEGRATED CIRCUIT AND DIGITAL DISC DRIVE

(75) Inventor: Fabienne Dreville, Montbonnot (FR)

(73) Assignee: STMicroelectronics SA, Montrouge (FR)

( * ) Notice: Subject to any disclaimer, the term of this patent is extended or adjusted under 35 U.S.C. 154(b) by 561 days.

(21) Appl. No.: 10/470,441

(22) PCT Filed: Jan. 30, 2002

(86) PCT No.: PCT/FR02/00358

§ 371 (c)(1),
(2), (4) Date: Nov. 10, 2003

(87) PCT Pub. No.: WO02/063444

PCT Pub. Date: Aug. 15, 2002

(65) Prior Publication Data

US 2004/0075476 A1   Apr. 22, 2004

(30) Foreign Application Priority Data

Feb. 2, 2001   (FR) .................... 01 01434

(51) Int. Cl.
*G06F 11/00* (2006.01)
(52) U.S. Cl. .................... 714/798; 714/770; 714/775

(58) Field of Classification Search ........... 714/798, 714/770, 771, 774, 775, 805, 808, 707, 54; 455/574, 343, 502, 503
See application file for complete search history.

(56) References Cited

U.S. PATENT DOCUMENTS

| | | | | |
|---|---|---|---|---|
| 5,184,091 A | * | 2/1993 | Srivastava | 331/10 |
| 5,461,642 A | | 10/1995 | Hutchins et al. | 375/327 |
| 5,570,397 A | * | 10/1996 | Kubista | 375/356 |
| 5,576,904 A | | 11/1996 | Behrens | 360/51 |
| 5,689,689 A | * | 11/1997 | Meyers et al. | 713/375 |
| 5,699,489 A | * | 12/1997 | Yokomizo | 358/1.9 |
| 6,189,076 B1 | * | 2/2001 | Fadavi-Ardekani et al. | 711/147 |
| 6,430,125 B1 | * | 8/2002 | Alon et al. | 369/44.32 |
| 6,535,946 B1 | * | 3/2003 | Bryant et al. | 710/305 |
| 6,810,483 B2 | * | 10/2004 | Bommaji | 713/400 |
| 6,983,032 B2 | * | 1/2006 | Mujica et al. | 375/375 |

FOREIGN PATENT DOCUMENTS

| | | |
|---|---|---|
| EP | 1037204 | 9/2000 |
| EP | 1073204 | 1/2001 |
| WO | 98/04074 | 1/1998 |

* cited by examiner

*Primary Examiner*—Albert Decady
*Assistant Examiner*—Fritz Alphonse
(74) *Attorney, Agent, or Firm*—Lisa K. Jorgenson; Allen, Dyer, Doppelt, Milbrath & Gilchrist, P.A.

(57) ABSTRACT

A synchronization variable intended for a second clock signal is generated from a first clock signal and a phase variation signal. A first approximation of the second clock signal is determined, and other approximations close to the first approximation are also determined. An error is calculated for each of the approximations, and the best approximation is taken as the second clock signal.

30 Claims, 4 Drawing Sheets

METHOD AND DEVICE FOR GENERATING A SYNCHRONIZATION VARIABLE AND THE CORRESPONDING INTEGRATED CIRCUIT AND DIGITAL DISC DRIVE

FIELD OF THE INVENTION

The invention relates to generation of a variable for synchronizing one signal with another signal, such as a clock signal. The invention advantageously applies, although this is not limiting, to the field of digital discs, and in particular, to compact disc read-only memory (CD-ROM) and digital video discs (DVD) for storing compressed picture data.

BACKGROUND OF THE INVENTION

Synchronization can be accomplished using an analog phase-locked loop, which is rather costly. Synchronization can also be accomplished using a digital phase-locked loop. However, calculating a synchronization variable, such as the time interval between a transition of an approximate signal and a transition of the signal to be obtained, requires division operations that are slow and costly in terms of calculation resources.

SUMMARY OF THE INVENTION

In view of the foregoing background, an object of the present invention is to provide a method of generating a synchronization variable WCS intended for a second clock signal $WP_2$ from a first clock signal $WP_1$ and a phase variation signal $\Delta\Psi$.

This and other objects, advantages and features of the present invention are provided by a method in which a first approximation $WS_0$ of the synchronization variable is determined, and other approximations close to the first approximation are determined. An error is calculated for each of the approximations, and the best approximation is taken as the synchronization variable.

Prior to determining the first approximation $WS_0$ of the synchronization variable, an approximation $P_{wp}$ of the period of the second clock signal $WP_2$ can be determined. A second approximation $WS_{p1}$ and a third approximation $WS_{m1}$ of the synchronization variable are preferably determined, where $WS_{p1}=WS_0+1$ and $WS_{m1}=WS_0-1$.

In one embodiment of the invention, the phase $\Psi$ is calculated at a given time by adding phase variation signals $\Delta\Psi$ of preceding times, and of the given time modulo of the period $Pw_{p1}$ of the clock signal $WP_1$. The first approximation $WS_0$ may be obtained from the following equation, in which A is a constant: $WS_0=\Psi*P_{wp}/A$. The error values may be determined corresponding to the following approximations:

$err\_0=(B*\Psi)-(C*\Delta\Psi*WS_0)$ $err\_p1=(B*\Psi)-(C*\Delta\Psi*(WS_0+1))$ $err\_m1=(B*\Psi)-(C*\Delta\Psi*(WS_0-1))$; where $B$ and $C$ are constants.

In one embodiment of the invention, the synchronization variable WCS is equal to the approximation generating the smallest error. The synchronization variable WCS is used to synchronize the clock signal $WP_2$ and the clock signal $WP_1$. A may be equal to $2^n$, where n is a predetermined constant and may be equal to 15.

Another aspect of the present invention relates to a device for generating a synchronization variable WCS intended for a second clock signal $WP_2$ from a first clock signal $WP_1$ and a phase variation signal $\Delta\Psi$. The device includes means or a circuit for determining a first approximation $WS_0$ of the synchronization variable, means or a circuit for determining other approximations close to the first approximation, means or a circuit for calculating the error for each of the approximations, and means or a circuit for taking the best approximation as the synchronization variable. The above device may also be included in an integrated circuit.

Another aspect of the present invention is directed to a digital disc reader that includes an optical head that emits an incident light beam and a plurality of photodetectors for detecting the reflection of the light beam from the disc. Summing means or a circuit sums the signals from the photodetectors two at a time and delivers two sampled incident signals. Calculator means or a circuit calculates the phase difference of the two sampled incident signals. The calculator means include the above device.

The digital disk reader calculates a variable, from which a signal can be generated whose phase is determined with known accuracy, from the relative phase between two individual signals from the photodetectors, which corresponds to the positioning error of an incident optical beam, for example a laser spot, illuminating the track on a digital disc. The optical system can then be modified to return the incident optical beam to the track and lock it there.

A digital disc has a single spiral track whose relief is representative of binary data stored on the track of the disc. The track is illuminated by an incident optical beam, for example a laser spot, and a plurality of photodetectors, for example four photodetectors, detect the reflection of the light beam from the disc.

The optical sensor formed by the photodetectors then supplies four individual signals delivered by the respective four photodetectors. These signals are also used to lock the optical beam onto the track on the disc. The optical sensor may also supply a global signal or a desired signal equal to the sum of the four individual signals, from which desired signal binary data read from the track is extracted.

The code used for coding the binary data on the disc is standardized, and is well known to one skilled in the art (for example, the RLL (2,10) code). To be more precise, the lengths of the pits and bosses on the spiral track on the disc determine the number of logic 0 values bracketing two logic 1 values. The lengths of the pits and bosses are all multiples of a basic length, commonly referred to by those skilled in the art as the basic length 1T. For example, the basic length 1T is 0.64 micron for a DVD and 1.6 microns for a CD-ROM.

When the digital disc is rotating, the desired signal containing the binary data, also referred to below as the incident signal, includes a succession of transitions whose spacings are representative of the lengths of the pulses. The higher the rotation speed of the disc, the smaller the spacings between the transitions.

The general principle of extracting the binary data conveyed by the incident signal includes detecting the transitions of the incident signal, calculating the distances between the successive transitions, and determining the data from the calculated distances.

The relative phase of two sampled incident signals can be calculated by an electronic device including the following components.

A detector stage detects the transitions of each incident signal relative to a predetermined threshold as well as so-called "minimum" samples of that signal whose levels are below a bottom threshold and so-called "maximum" samples whose levels are above a top threshold.

A first pair of blocks is associated with a first incident signal and a second pair of blocks is associated with a second incident signal. Each block includes memory elements for storing the levels of a predetermined set of samples of the corresponding incident signal. The set includes at least one minimum sample, one maximum sample, and two intermediate samples representative of a transition of the incident signal located between the minimum and maximum samples. Each block may also include first, second and third time counters clocked by the sampling clock signal, which are respectively associated with the minimum and maximum samples and one of the intermediate samples.

Control means is adapted, in the presence of two minimum samples or two maximum samples respectively relating to two incident signals, for storing the first set of samples relating to the first signal in one of the blocks of the first pair and the first set of samples relating to the second signal in the like block of the second pair. The subsequent successive sets of samples of each incident signal is alternately and successively stored in the two blocks of each pair, starting with the other block of each pair. The time counter associated with the stored sample is initialized, and a block validation signal is delivered when the corresponding set of samples has been stored in the memory elements of the block.

Post-processing means is adapted to determine the relative phase of the two incident signals in the presence of two block validation signals relating to two like blocks of two pairs, at least from values of the third time counters of the two blocks and the levels of the intermediate samples stored in the two blocks.

This kind of electronic device for calculating a relative phase can be used upstream of the device for generating a synchronization variable to supply it with a phase variation signal $\Delta\Psi$.

BRIEF DESCRIPTION OF THE DRAWINGS

The present invention will be better understood after reading the following detailed description of one embodiment of the invention, the description of which is given by way of non-limiting examples only and refers to the accompanying drawings, in which.

DETAILED DESCRIPTION OF THE PREFERRED EMBODIMENTS

Figure 1:
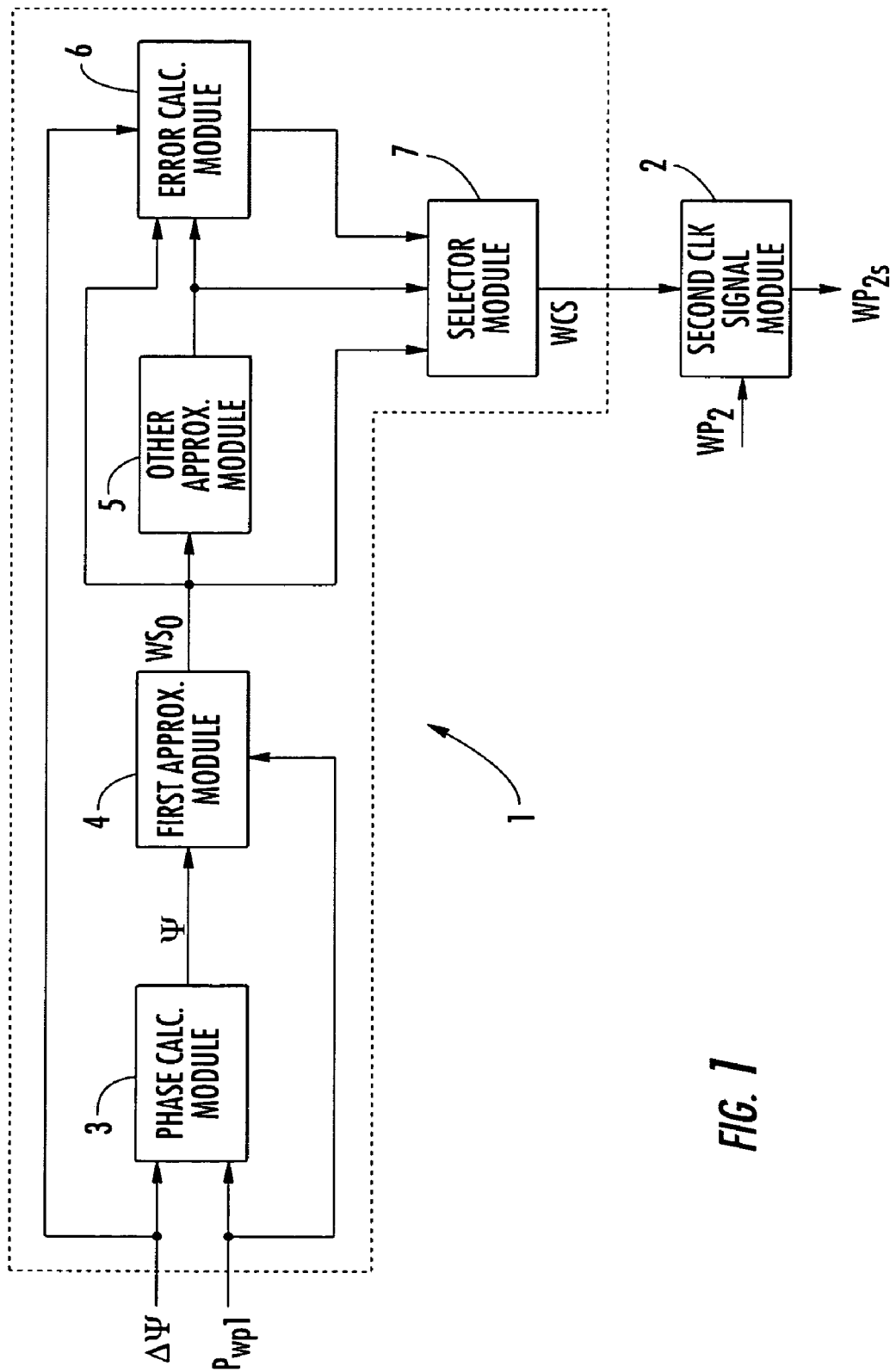
FIG. 1 is a diagrammatic view of one embodiment of a device in accordance with the invention.

The invention synchronizes two clock signals using fast and inexpensive digital means or circuits. As illustrated in FIG. 1, the device 1 for generating a synchronization variable WCS receives as input a phase variation signal $\Delta\Psi$ which can be generated as explained below with reference to FIG. 4, and a period signal $P_{wp1}$ of the first clock signal $WP_1$ at a frequency of 20 MHz, for example. The synchronization signal WCS at the output of the device 1 is fed to a module 2 which also receives as input a second clock signal $WP_2$ and is capable of supplying at its output a synchronized clock signal $WP_{2s}$ whose frequency is equal to that of the clock signal $WP_2$ and which is synchronized to the signal $WP_1$.

A module, not shown, can be provided for calculating an approximation $P_{wp}$ of the period of the second clock signal $WP_2$. The following condition applies: $P_{wp}=B/\Delta\Psi$, where B is a constant that depends on the number of bits used for the calculation, the frequency of the signal $WP_1$, a sampling frequency, for example 400 MHz, and a writing frequency, for example 130 kHz. To simplify the calculations, $P_{wp}$ can be pre-calculated for intervals of $\Delta\Psi$.

The device 1 includes a module 3 for calculating the phase $\Psi$ from the phase variation signal $\Delta\Psi$ and the period $P_{wp1}$. The module 3 adds the phase variations of the preceding times and the phase variation of the current time modulo of the period $P_{wp1}$. In other words, the module 3 performs the following operations:

$\Psi_{n+1}$ takes the value $\Psi_n+\Delta\Psi_{n+1}$; and if $\Psi_{n+1} \geq \Psi_{max}$, then $\Psi_{n+1}$ takes the value $\Psi_{n+1}-\Psi_{max}$.

$\Psi_{max}$ is the maximum value of the phase, i.e., its value at time $P_{wp1}$. The phase $\Psi$ can be determined from a phase variation signal coming from another clock, not shown, at a different frequency but with a particular phase. To simplify the calculations, the phase $\Psi$ can be calculated every p periods of the first clock signal $WP_1$, where p>1.

The device 1 includes a module 4 which receives the phase signal $\Psi$ from the module 3 and the approximate period $P_{wp1}$. The module 4 determines a first approximation $WS_0$ of the synchronization variable WCS, with: $WS_0=\Psi*P_{wp}/A$, where A is a constant. The value of A is predetermined as a function of the clock signal to be synchronized and will be taken as equal to a power of 2. For example, the value $A=2^{15}$ can be taken.

The device 1 includes a module 5 for determining other approximations close to the first approximation $WS_0$. The module 5 is connected to the output of the module 4. The module 5 performs an addition operation to generate a second approximation $WS_{p1}$, and a subtraction operation to generate a third approximation $WS_{m1}$, with $WS_{p1}=WS_0+1$ and $WS_{m1}=WS_0-1$. Three approximations are obtained at the output of the module 5. The first one lying between the second and third ones so that their respective precisions can be compared.

The device 1 includes a module 6 for calculating errors, which receives the first approximation $WS_0$ from the module 4 and the second and third approximations $WS_{p1}$ and $WS_{m1}$ from the module 5. The module 6 also receives the phase variation signal $\Delta\Psi$. The module 6 calculates three error values err_0, err_p1 and err_m1 respectively corresponding to the first, second and third approximations $WS_0$, $WS_{p1}$ and $WS_{m1}$, where:

$err\_0 = (B*\Psi) - (C*\Delta\Psi*WS_0)$ $err\_p1 = (B*\Psi) - (C*\Delta\Psi*(WS_0+1))$ $err\_m1 = (B*\Psi) - (C*\Delta\Psi*(WS_0-1))$, and where B and C are constants.

Calculating error values uses addition, subtraction and multiplication operations, but no division operations, which are slow and costly in terms of calculation resources. The constants B and C are predetermined as a function of the signals to be synchronized. The following values can be taken, for example: B=20 and C=13.

The device 1 includes a selector module 7 which receives the three error values err_0, err_p1 and err_m1 from the error module 6, the first approximation $WS_0$ from the module 4, and the second and third approximations $WS_{p1}$ and $WS_{m1}$ from the module 5. The module 7 determines which of the aforementioned errors is the smallest one and sends to its output the approximation subject to the smallest error. The approximation is sent to the output of the device 1 as the synchronization variable WCS. In other words:

if $err$-$0$=min($err$_0,$err$_p1,$err$_m1$), then
$WCS=WS_0$;

if $err$_p1=min($err$_0,$err$_p1,$err$_m1$), then
$WCS=WS_{p1}$;

if not $WCS=WS_{m1}$.

Figure 2:
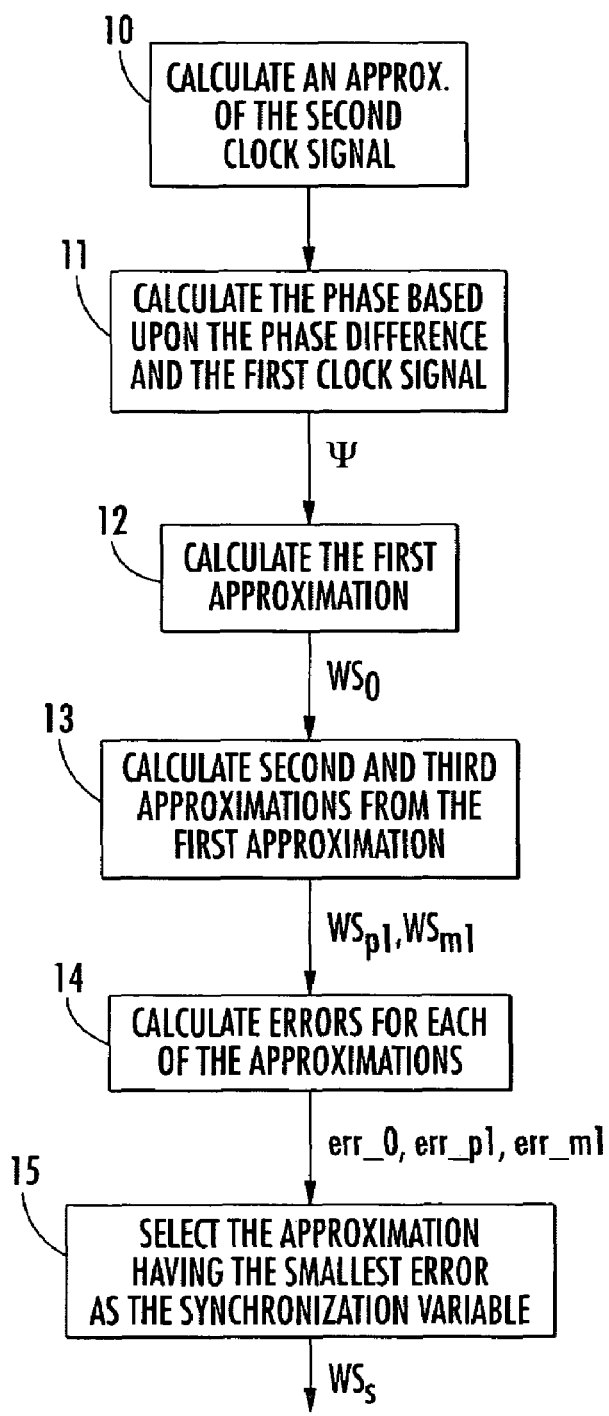
FIG. 2 is a flowchart of method steps in accordance with the invention.

The device 1 is advantageously integrated and forms a portion of an integrated circuit. FIG. 2 shows steps performed in chronological order to execute the method. Step 10 calculates an approximation $P_{wp}$ of the period of the second clock signal. Step 11 calculates the phase $\Psi$ as a function of the phase difference $\Delta\Psi$ and the period $P_{wp1}$. Step 12 calculates the first approximation $WS_0$ as a function of the phase $\Psi$ and the approximate period $P_{wp1}$. Step 13 calculates the second and third approximations $WS_{p1}$ and $WS_{m1}$ from the first approximation $WS_0$. Step 14 calculates the errors corresponding to each of the approximations. Step 15 takes as the synchronization variable the approximation with the smallest error.

Figure 3:
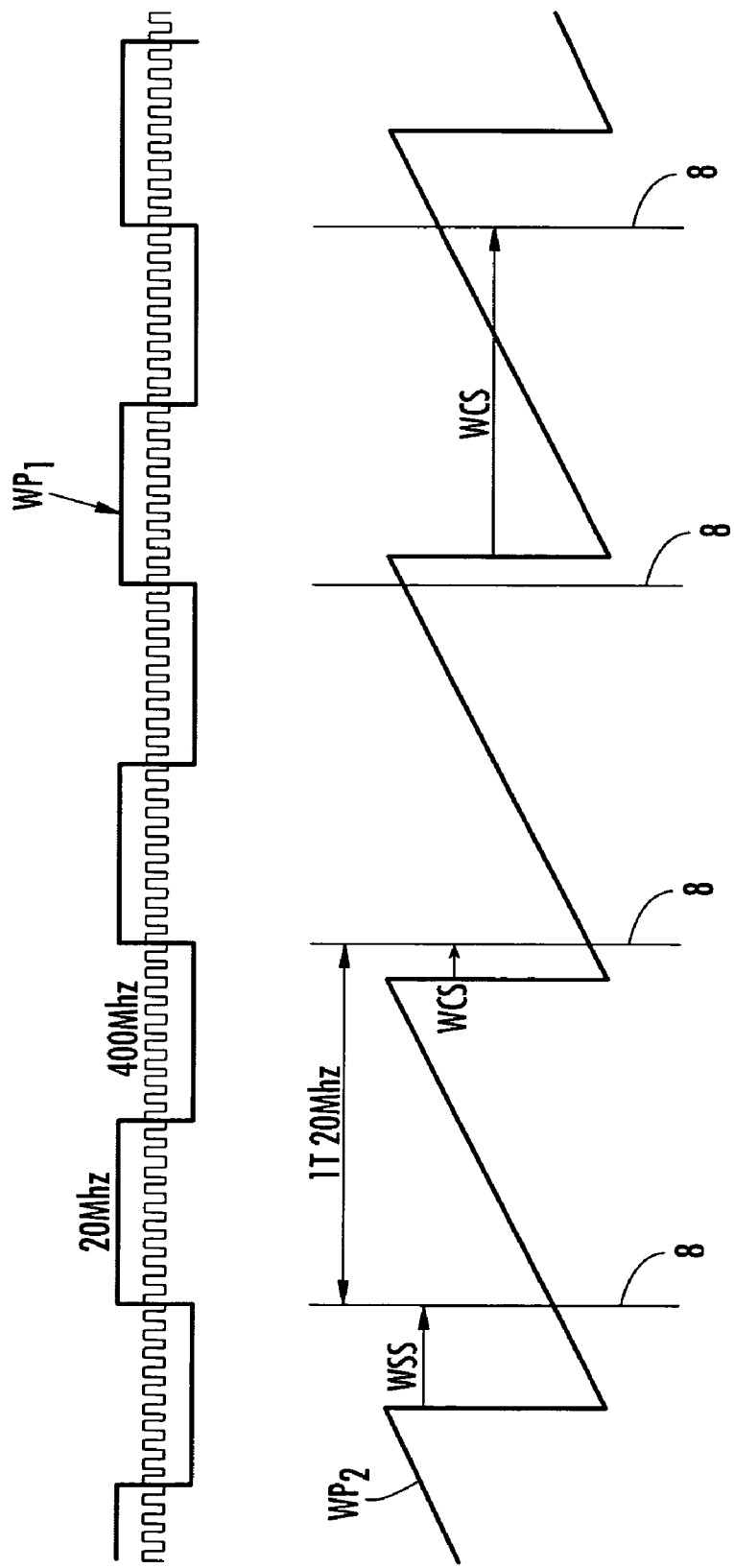
FIG. 3 is a diagrammatic view of signals in accordance with the invention.

FIG. 3 shows various signals described above. The clock signal $W_{p1}$ has a frequency of 20 MHz. The vertical lines 8 correspond to the upward transitions of the clock signal $W_{p1}$. Between two downward transitions, the signal $W_{p2}$ defines a writing period that has to be determined. The signal $W_{p2}$ can be entirely determined knowing the upward transitions of the signal $W_{p1}$ and the synchronization variable WCS. This can be defined as the time difference between a downward transition of the signal $W_{p2}$ and the next upward transition of the signal $W_{p1}$.

Figure 4:
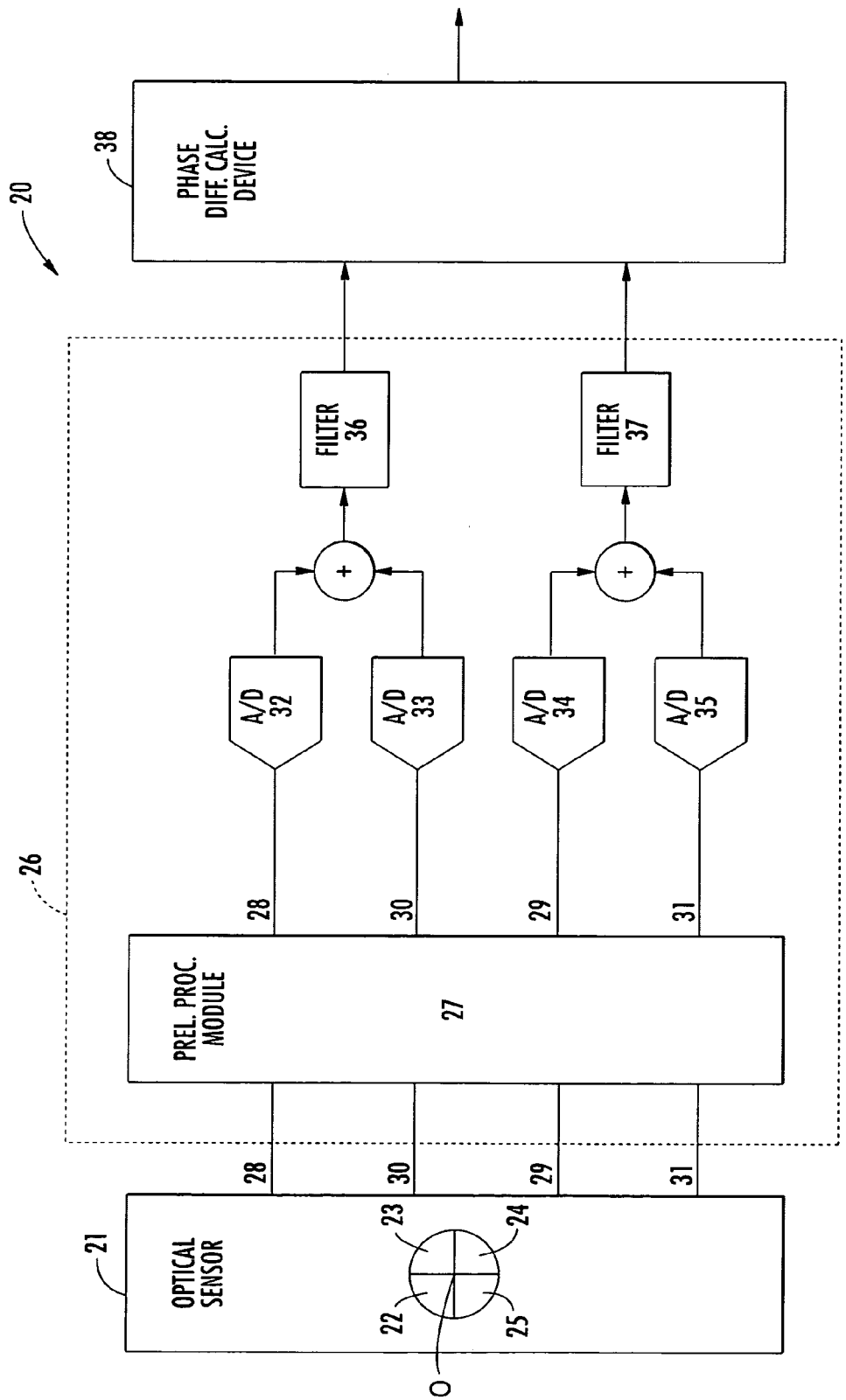
FIG. 4 is a partial diagrammatic view of the internal architecture of a digital disc reader, in particular a DVD reader, in accordance with the invention.

FIG. 4 shows parts of a DVD reader 20, which are useful for describing means for calculating a phase difference $\Delta\Psi$. An optical sensor 21 is made up of four photodetectors 22, 23, 24, 25. A laser diode emits a laser beam that is directed via a splitter plate and a conventional optical system onto the face of the disc on which is etched the track containing the data. The beam reflected by the disc then passes through the splitter plate in the opposite direction and is picked up by the four photodetectors 22, 23, 24, 25.

All four of the photodetectors are in a plane parallel to the plane of the disc. Each photodetector delivers a signal. The individual signals 28, 29, 30, 31 are then processed in a first processor stage 26 having at its input a preliminary processor module 27 that includes amplifiers. The structure of the module 27 is known in the art. The signals 28, 29, 30, 31 delivered by the module 27 are then sampled in four analog-digital converters 32 to 35. The sampling clock signal is generated using a quartz crystal, for example (not shown here for simplicity).

The two individual signals obtained from the two photodetectors that are symmetrical with respect to the top center point of the sensor are then summed in two adders. One of the secondary signals is equal to the sum of the individual signals 28 and 30, and the other secondary signal is equal to the sum of the individual signals 29 and 31.

The summed signals are then filtered in respective identical low-pass filters 36 and 37. The processor stage 26 therefore supplies two sampled incident signals whose phase difference is representative of the positioning error of the optical beam relative to the track on the disc. The two sampled signals are processed by the phase difference calculation device according to the invention incorporated in the stage 38, the latter device delivering a positioning error that is used in a conventional way in a control loop to modify the incident optical signal and return the optical beam to the track on the disc and lock it there. The positioning error can be taken as a phase difference or subjected to intermediate processing before it is used by the device 1 shown in FIG. 1.

The skilled person knows that the optical sensor formed of the photodetectors 22, 23, 24, 25 delivers, in addition to the four individual signals 28, 29, 30, 31, a global signal or desired signal equal to the sum of the four individual signals, from which desired signal binary data read from the track is extracted. The processor means for extracting the coded data that are conventionally part of a digital disc reader are not shown, for simplicity.

The invention claimed is:

1. A method for generating a synchronization variable for a second clock signal from a first clock signal and a phase variation signal, the method comprising:
   determining a first approximation of the synchronization variable;
   determining at least one approximation close to the first approximation;
   calculating an error value for each of the approximations; and
   selecting a best approximation as the synchronization variable based upon the calculated error values.

2. A method according to claim 1, further comprising determining an approximation of a period of the second clock signal prior to determining the first approximation of the synchronization variable.

3. A method according to claim 1, wherein determining the at least one approximation comprises determining a second approximation $WS_{p1}$ and a third approximation $WS_{m1}$ of the synchronization variable, where $WS_{p1}=WS_0+1$ and $WS_{m1}=WS_0-1$, where $WS_0$ is the first approximation.

4. A method according to claim 3, wherein the error values for the first, second and third approximations are respectively obtained from the following equations:

$err\_0=(B*\Psi)-(C*\Delta\Psi*WS_0)$;

$err\_p1=(B*\Psi)-(C*\Delta\Psi*(WS_0+1))$; and $err\_m1=(B*\Psi)-(C*\Delta\Psi*(WS_0-1))$;

where B and C are constants, $WS_0$ is the first approximation, $\Delta\Psi$ is the phase variation signal, and $\Psi$ is the phase that is determined by adding phase variation signals of preceding times and a time modulo of a period of the first clock signal.

5. A method according to claim 1, further comprising calculating a phase by adding phase variation signals of preceding times and a time modulo of a period of the first clock signal.

6. A method according to claim 5, wherein the first approximation $WS_0$ is obtained from the following equation: $WS_0=\Psi*P_{wp}/A$, where $\Psi$ is the phase, $P_{wp}$ is a period of the second clock signal, and A is a constant.

7. A method according to claim 6, wherein A is equal to $2^n$, with n being a predetermined constant.

8. A method according to claim 1, wherein selecting the synchronization variable is based upon selecting the approximation having a smallest calculated error value.

9. A method for generating a synchronization variable for a second clock signal from a first clock signal and a phase variation signal, the method comprising:
   calculating a phase by adding phase variation signals of preceding times and a time modulo of a period of the first clock signal;
   determining a first approximation of the synchronization variable based upon the phase and the first clock signal;
   determining at least one approximation close to the first approximation;
   calculating an error value for each of the approximations; and
   selecting the approximation having a smallest calculated error value as the synchronization variable.

10. A method according to claim 9, further comprising determining an approximation of a period of the second clock signal prior to determining the first approximation of the synchronization variable.

11. A method according to claim 9, wherein determining the at least one approximation comprises determining a second approximation $WS_{p1}$ and a third approximation $WS_{m1}$ of the synchronization variable, where $WS_{p1}=WS_0+1$ and $WS_{m1}=WS_0-1$, where $WS_0$ is the first approximation.

12. A method according to claim 9, wherein the first approximation $WS_0$ is obtained from the following equation: $WS_0=\Psi*P_{wp}/A$, where $\Psi$ is the phase, $P_{wp}$ is a period of the second clock signal, and A is a constant.

13. A method according to claim 12, wherein A is equal to $2^n$, with n being a predetermined constant.

14. A device for generating a synchronization variable for a second clock signal from a first clock signal and a phase variation signal, the device comprising:
   a first approximation module for determining a first approximation of the synchronization variable;
   a second approximation module connected to said first approximation module for determining at least one approximation close to the first approximation;
   an error module connected to said first and second approximation modules for calculating an error for each of the approximations; and
   a selector module connected to said first and second approximation modules and to said error module for selecting a best approximation as the synchronization variable based upon the calculated error values.

15. A device according to claim 14, wherein said first approximation module also determines an approximation of a period of the second clock signal prior to determining the first approximation of the synchronization variable.

16. A device according to claim 14, wherein said second approximation module determines a second approximation $WS_{p1}$ and a third approximation $WS_{m1}$ of the synchronization variable, where $WS_{p1}=WS_0+1$ and $WS_{m1}=WS_0-1$, where $WS_0$ is the first approximation.

17. A device according to claim 16, wherein said error module respectively obtains the error values for the first, second and third approximations from the following equations:

$$err\_0=(B*\Psi)-(C*\Delta\Psi*WS_0);$$

$$err\_p1=(B*\Psi)-(C*\Delta\Psi*(WS_0+1));\text{ and}$$

$$err\_m1=(B*\Psi)-(C*\Delta\Psi*(WS_0-1));$$

where B and C are constants, $WS_0$ is the first approximation, $\Delta\Psi$ is the phase variation signal, and $\Psi$ is the phase that is determined by adding phase variation signals of preceding times and a time modulo of a period of the first clock signal.

18. A device according to claim 14, further comprising a phase calculation module having an input for receiving the first clock signal and the phase variation signal, said phase calculation module for calculating a phase by adding phase variation signals of preceding times and a time modulo of a period of the first clock signal.

19. A device according to claim 18, wherein said first approximation obtains the first approximation $WS_0$ from the following equation: $WS_0=\Psi*P_{wp}/A$, where $\Psi$ is the phase, $P_{wp}$ is a period of the second clock signal, and A is a constant.

20. A device according to claim 19, wherein A is equal to $2^n$, with n being a predetermined constant.

21. A device according to claim 14, wherein the best approximation is the approximation having a smallest calculated error value.

22. A device according to claim 14, further comprising a substrate, wherein said first and second approximation modules, said error module and said selector module are on said substrate so that the device is an integrated circuit.

23. A digital disc reader comprising:
   an optical head that emits a light beam onto a disc;
   a plurality of photodetectors for detecting reflection of the light beam from the disc and for providing a plurality of signals based upon the reflected light beam;
   a summing circuit for summing the plurality of signals two by two and for delivering first and second sampled signals; and
   a calculator circuit for calculating a phase difference of the first and second sampled signals and for providing a positioning error for modifying the light beam, said calculator circuit comprising
      a first approximation module for determining a first approximation of the positioning error,
      a second approximation module for determining at least one approximation close to the first approximation,
      an error module for calculating an error for each of the approximations, and
      a selector module for selecting a best approximation as the positioning error based upon the calculated error values.

24. A digital disc reader according to claim 23, wherein said first approximation module also determines an approximation of a period of the second sampled signal prior to determining the first approximation of the positioning error.

25. A digital disc reader according to claim 23, wherein said second approximation module determines a second approximation $WS_{p1}$ and a third approximation $WS_{m1}$ of the positioning error, where $WS_{p1}=WS_0+1$ and $WS_{m1}=WS_0-1$, where $WS_0$ is the first approximation.

26. A digital disc reader according to claim 23, further comprising a phase calculation module for calculating a phase by adding phase variation signals of preceding times and a time modulo of a period of the first sampled signal.

27. A digital disc reader according to claim 26, wherein said first approximation obtains the first approximation $WS_0$ from the following equation: $WS_0=\Psi*P_{wp}/A$, where $\Psi$ is the phase, $P_{wp}$ is a period of the second sampled signal, and A is a constant.

28. A digital disc reader according to claim 27, wherein A is equal to $2^n$, with n being a predetermined constant.

29. A digital disc reader according to claim 23, wherein said error module respectively obtains the error values for the first, second and third approximations from the following equations:

$$err\_0 = (B*\Psi) - (C*\Delta\Psi*WS_0);$$

$$err\_p1 = (B*\Psi) - (C*\Delta\Psi*(WS_0+1));\text{ and}$$

$$err\_m1 = (B*\Psi) - (C*\Delta\Psi*(WS_0-1));$$

where B and C are constants, $WS_0$ is the first approximation, $\Delta\Psi$ is the phase variation signal, and $\Psi$ is the phase that is determined by adding phase variation signals of preceding times and a time modulo of a period of the first sampled signal.

30. A digital disc reader according to claim 23, wherein the best approximation is the approximation having a smallest calculated error value.

* * * * *